(12) United States Patent
Durston

(10) Patent No.: US 6,670,837 B2
(45) Date of Patent: Dec. 30, 2003

(54) TIME DOMAIN REFLECTOMETER WITH DIGITALLY GENERATED VARIABLE WIDTH PULSE OUTPUT

(75) Inventor: Thomas W Durston, Oceanside, CA (US)

(73) Assignee: Tempo Research Corporation, Vista, CA (US)

( * ) Notice: Subject to any disclaimer, the term of this patent is extended or adjusted under 35 U.S.C. 154(b) by 197 days.

(21) Appl. No.: 09/967,686

(22) Filed: Sep. 26, 2001

(65) Prior Publication Data

US 2003/0058015 A1 Mar. 27, 2003

(51) Int. Cl.[7] .............................................. H03K 3/017
(52) U.S. Cl. ...................................... 327/172; 327/214
(58) Field of Search ................................ 327/214, 216, 327/217, 218, 172, 173, 174, 175, 176

(56) References Cited

U.S. PATENT DOCUMENTS

| 4,989,175 A | * | 1/1991 | Boris et al. ................. 713/401 |
| 5,124,573 A | * | 6/1992 | Wong .......................... 327/155 |
| 5,949,266 A | * | 9/1999 | Hinds et al. ................. 327/208 |
| 5,963,106 A | * | 10/1999 | Blyth et al. ................. 327/172 |
| RE36,480 E | * | 1/2000 | Bourgeois et al. .......... 327/281 |

* cited by examiner

Primary Examiner—Timothy P. Callahan
Assistant Examiner—Linh Nguyen
(74) Attorney, Agent, or Firm—Pillsbury Winthrop LLP

(57) ABSTRACT

A pulse generator includes circuitry for starting a pulse in response to receipt of a pulse enable signal. The pulse enable signal is synchronous with a first time base. The pulse generator includes circuitry for ending the pulse after a predetermined, user selectable, number of clock cycles. The clock cycles have a second time base that is asynchronous with the first time base. Since the end pulse signal is not on the same time base as the pulse enable signal, there is up to one asynchronous clock cycle period random variation in width of pulses having the same nominal width.

26 Claims, 2 Drawing Sheets

TIME DOMAIN REFLECTOMETER WITH DIGITALLY GENERATED VARIABLE WIDTH PULSE OUTPUT

CROSS REFERENCE TO RELATED APPLICATIONS

The present Application is related to U.S. application Ser. No. 09/967,633, filed Sep. 26, 2001, titled MULTI-FUNCTION DATA ACQUISITION SYSTEM AND METHOD, and U.S. application Ser. No. 09/967,457, filed Sep. 26, 2001, titled TIME DOMAIN REFLECTOMETER WITH WIDEBAND DUAL BALANCED DUPLEXER LINE COUPLING CIRCUIT, the disclosures of which are incorporated herein by reference.

FIELD OF THE INVENTION

The present invention relates generally to the field of time domain reflectometers, and more particularly to a time domain reflectometer with a digitally generated variable width pulse output.

BACKGROUND OF THE INVENTION

Time domain reflectometry is commonly used within the telephone and cable television industries. A Time Domain Reflectometer ("TDR") sends a pulse down a transmission line and then monitors the transmission line for any reflections of that pulse. Reflections are caused by changes in impedance along the transmission line. A change in impedance may indicate the presence of a fault. As a pulse transmitted by a TDR reaches the impedance mismatch, a portion of the transmitted pulse is reflected back to the TDR. Because the transmitted and reflected pulses travels along the transmission line at a known speed of propagation, the exact location of the impedance mismatch may be determined by measuring the time at which the transmitted pulse is transmitted and the time at which the reflected pulse is received by the TDR.

The magnitude of the reflected pulse is proportional to the magnitude of the impedance mismatch. The sign or polarity of the reflected pulse is determined by the direction of the change in impedance. For example, if the transmitted pulse is positive and the impedance at the fault increases, then the reflected pulse will be positive. A break in the line will result in strong positive reflected pulse. If the transmitted pulse is positive and the impedance at the fault decreases, then the reflected pulse will be negative. For example, a short in the line will produce a negative reflected pulse. Thus, the nature of the fault may be determined or inferred from analysis of the reflected waveforms.

The energy of the transmitted pulse is dependent on the width of the pulse. The larger the pulse width, the more energy is transmitted and therefore the further the signal will travel down the line. Accordingly, many currently available TDRs have a limited number selectable pulse width settings. Each pulse setting produces pulses of substantially identical width. Thus, each pulse of a selected width has a substantially identical frequency spectrum, which can result in electromagnetic interference with digital services on the line.

Conventional TDR pulse generation technology uses low speed logic to generate pulses or analog RLC circuits to generate half-sine wave transmitted pulses. The rise time of conventionally generated pulses is relatively slow, thereby making it very difficult to interpret reflections from some types of faults such as water in the cable, bridge taps, untwisted cable, etc. The slow rise time problem is particularly acute when using long half-sine wave transmitted pulses.

SUMMARY OF THE INVENTION

The present invention provides a digital variable width pulse generator that finds particular application in a time domain reflectometer. The pulse generator of the present invention includes circuitry for starting a pulse in response to receipt of a pulse enable signal. The pulse enable signal is synchronous with a first time base. For example, the time base for the pulse enable signal may be 5.529 MHz. The pulse generator includes circuitry for ending said pulse a predetermined, user selectable, number of clock cycles after the pulse enable signal. The clock cycles are have a second time base that is asynchronous with the first time base. For example, the time base of the clock signal may be 80 MHz. Since the end pulse signal is not on the same time base as the pulse enable signal, there is up to one asynchronous clock cycle period random variation in width of pulses having the same nominal width. For example, in the 80 MHz example, a nominal 100 nanosecond pulse may range continuously from 100 nanoseconds to 112.5 nanoseconds in width. The random variation in pulse width produces a spread spectrum effect.

DESCRIPTION OF THE PREFERRED EMBODIMENT

Figure 1:
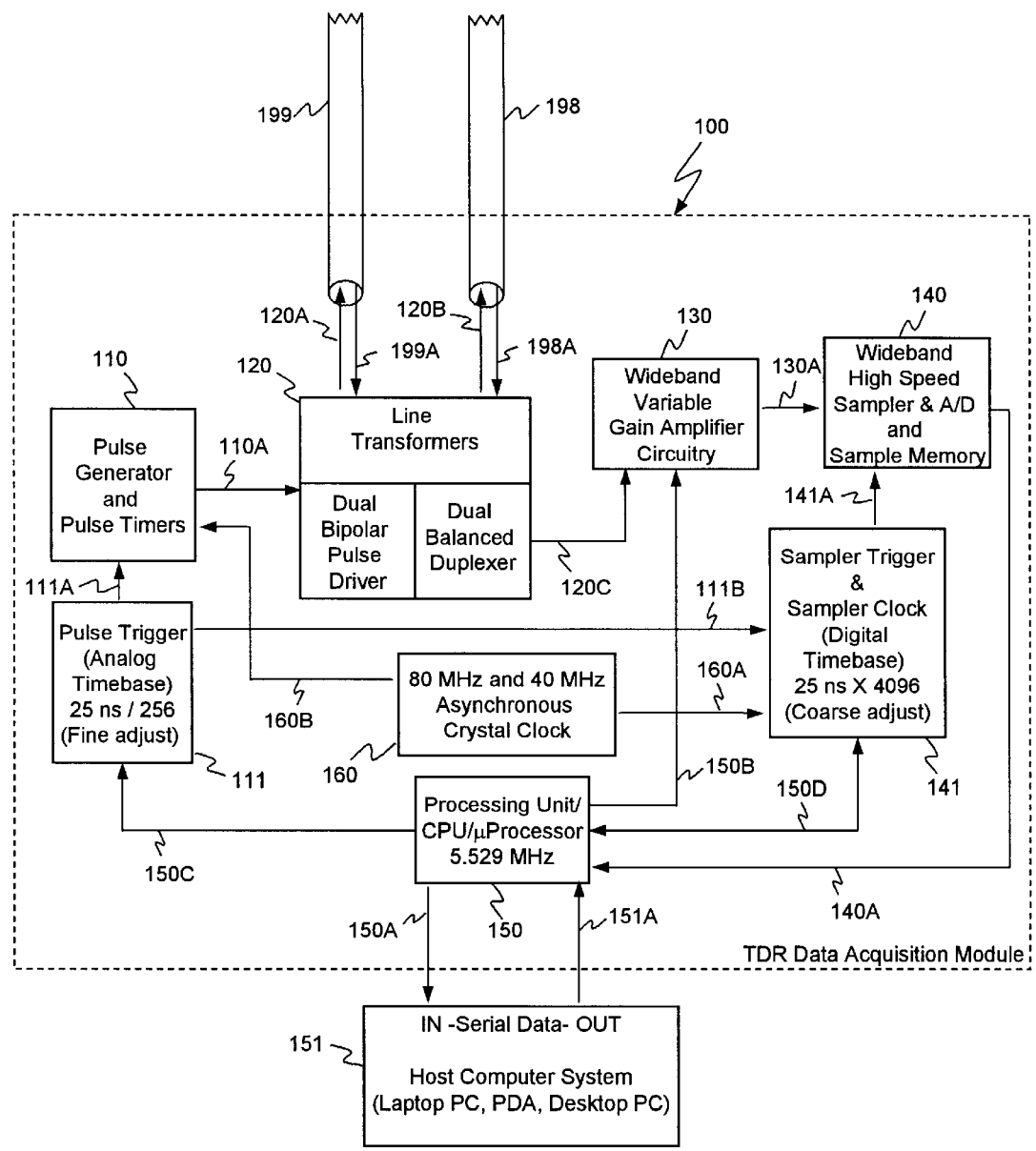
FIG. 1 is a high level block diagram of a time domain reflectometer according to one embodiment of the present invention.

Referring now to the drawings, and first to FIG. 1, a data acquisition system is designated generally by the numeral 100. In the preferred embodiment, data acquisition module 100 incorporates time domain reflectometer (TDR) functionality with spectrum analyzer capabilities. Module 100 generally comprises the following: a pulse generator 110; line transformers 120; high speed wideband variable gain amplifier and attenuation circuitry (amplifier component) 130; a wideband high speed sampler, A/D converter, and sample data storage medium or memory (sampler component) 140; and a processing unit 150. Additionally, module 100 includes a pulse trigger 111, a sampler trigger 141, and an asynchronous clock 160 coupled as illustrated in FIG. 1.

A user at a host computer system 151 may selectively control operational characteristics or functionality of module 100. As indicated in FIG. 1, host computer 151 may be embodied in a desktop personal computer (PC) or workstation, a portable or laptop computer system, a personal digital assistant (PDA), or other electronic equipment or computerized systems having suitable hardware and software to support a two-way data communication coupling to module 100.

In that regard, host computer 151 may be coupled to module 100 using various hardware interfaces and communication protocols known in the art; while this coupling is illustrated as a serial data link in FIG. 1, those of skill in the art will appreciate that bi-directional data communication between processing unit 150 and host computer 151 may be enabled by any hardware interface and data transmission protocol known in the art or developed and operative in accordance with known principles. In some embodiments, for example, module 100 may be coupled to a remote host computer 151 via a wire-line or wireless network connection. Examples of suitable hardware connections and protocols for coupling processing unit 150 and host computer 151 include, but are not limited to: Transmission Control Protocol/Internet Protocol (TCP/IP); Ethernet connections; Fiber Distributed Data Interface (FDDI); ARCNET; token bus or token ring networking technology; Universal Serial Bus (USB) connections; and Institute of Electrical and Electronics Engineers (IEEE) Standard 1394 (typically referred to as "FireWire") connections.

As will be explained in detail hereinafter, pulse trigger 111 controls pulse generation, by transmitting a pulse trigger or pulse enable signal 111A to pulse generator 110. As indicated in FIG. 1, pulse trigger 111 is responsive to a control signal 150C transmitted from processing unit 150, and may fine tune a pulse delay by dividing a default delay time or clock cycle (25 nanoseconds (ns), for example) into a selected one of a predetermined number of increments (256 increments, for example). Accordingly, analog time base pulses may selectively delay pulse trigger signal 111A from a relatively long 25 ns to a relatively short 25/256 or 0.097 ns.

According to the present invention and as will be explained in detail hereinafter, pulse generator 110 transmits a pulse 110A responsive to pulse enable signal 111A, the width of which pulse is determined according to an asynchronous clock signal 160B from clock 160. Line transformers 120 comprise wideband coupling circuitry capable of operating in the 10 kHz–500 MHz frequency range; in that regard, a dual bipolar pulse driver and a dual balanced duplexer are provided to analyze a two-conductor transmission line (designated by reference numerals 199 and 198). In particular, a bipolar pulse driver is operative to alter pulse 110A in a manner appropriate for the specific test to be conducted on conductors 199–198; such a suitable pulse driver may then create and transmit incident pulses 120A and 120B through conductors 199 and 198, respectively. Incident pulses 120A,120B may be of any selected frequency and duration specified by processing unit 150 under control of host computer 151. Conductors 199 and 198 may comprise a twisted pair transmission line, coaxial cable, or other transmission line.

Events or impedance discontinuities existing in conductors 199 and 198 create reflection pulses 199A and 198A, respectively, which are received by the dual balanced duplexer component of the line transformers 120. In operation, the duplexer may provide amplification of received reflection pulses 199A, 198A; such amplification at the receiver side of line transformers 120 may be a factor of 2 or more (2×) for typical TDR applications and line performance or spectrum analyses. In some embodiments, the duplexer may be additionally configured to attenuate or to cancel incident pulses 120A, 120B or their effects on the receiver side of line transformers 120, minimizing or eliminating the "dead zone" characteristic of conventional TDR equipment.

As indicated in FIG. 1, the duplexer is configured to transmit a signal 120C representative of reflection pulses 199A, 198A to high speed wideband variable gain amplifier component 130. Amplifier component 130 may provide both amplification and attenuation functionality responsive to a control signal 150B transmitted from processing unit 150. Output 130A from amplifier component 130 may be directed to sampler component 140.

As depicted in FIG. 1, sampler component 140 may generally be constituted by a high speed sampler, a high speed A/D converter, and memory for storing sample data. The sampler may sample the input (130A) at discrete time intervals or on a continuous, or streaming, basis; in that regard, sampler operation may be controlled by a sampler trigger signal 141A transmitted by sampler trigger 141 as well as by a control signal 150D transmitted by processing unit 150. Control signal 150D may determine the operational mode in which sampler component 140 functions (i.e. discrete samples or streaming conversion at a particular frequency), while trigger signal 141A may determine the sample rate or frequency employed.

It will be appreciated that sampler trigger 141 may be operative in accordance with timing signals 160A received from clock 160. As is generally known in the art, synchronous clock 160 may be configured to provide signals at two different clock rates, e.g. 80 MHz and 40 MHz, as shown in FIG. 1. In contrast to pulse trigger 111, sampler trigger 141 may employ a digital time base generating signals in increments of 25 ns responsive to timing signal 160A.

In some embodiments, the sampler may provide sample data to the A/D converter, which may subsequently transmit digital data signals (represented by signal 140A) to processing unit 150 immediately; additionally or alternatively, the A/D converter may store digital data samples temporarily in memory.

The memory component may be implemented in random access memory (RAM) chips, for example, or any other suitable data storage medium configured and operative to store or to buffer digital data including, but not limited to: fast static random access memory (SRAM), or transistor-based memory components; erasable programmable read only memory (EPROM); flash memory; various magnetic, optical, or magneto-optical disc media; and the like.

Figure 2:
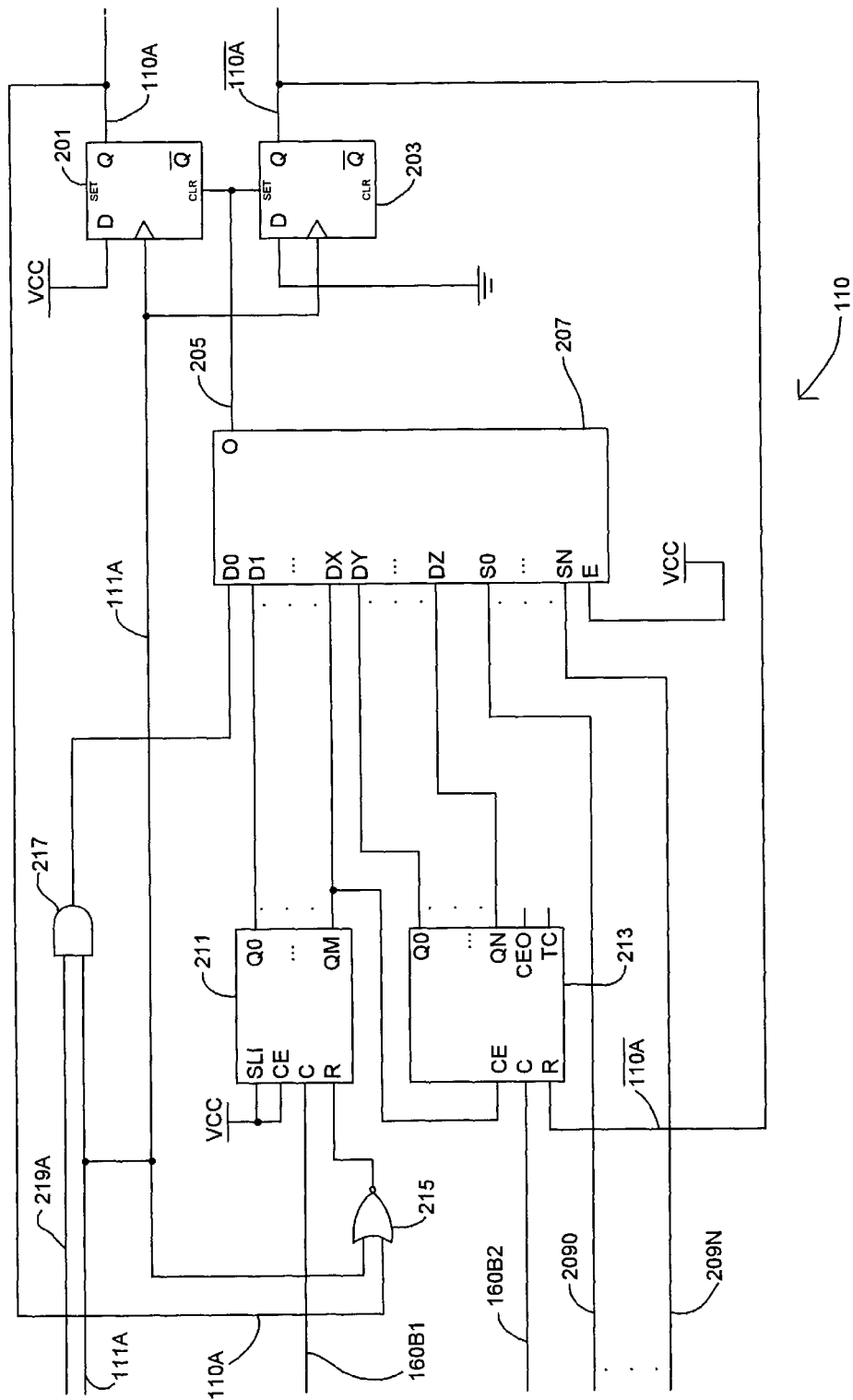
FIG. 2 is logic diagram of a pulse generator and pulse timer according to one embodiment of the present invention.

Referring now to FIG. 2, there is illustrated a logic diagram of pulse generator and pulse timers 110 according to one embodiment of the present invention. Pulse generator 110 includes a pair of logic devices, which in the preferred embodiment are implemented in D flip flops 201 and 203. Flip flops 201 and 203 are configured according to the present invention to produce complementary output signals 110A and $\overline{110A}$ at their respective Q outputs. The D input of flip flop 201 is coupled to system voltage VCC. The D input of flip flop 203 is coupled to system ground.

The clock inputs of flip flops 201 and 203 are each coupled to pulse enable signal 111A, which is received from pulse trigger 111 of FIG. 1. It will be recalled form FIG. 1, that pulse trigger signal 111A is synchronized with the 5.529 megahertz clock of processor 150. As will be apparent to those skilled in the art, upon receipt of the rising edge of pulse enable signal 111A at the clock input of flip flop 201, its Q output is driven to system voltage VCC. In complementary fashion, upon receipt of the rising edge of pulse enable signal 111A at the clock input of flip flop 203, its Q input is driven to ground. Flip flops 201 and 203 are selected to produce fast transitions.

According to the present invention, complementary pulses 110A and $\overline{110A}$ are terminated after a user selectable pre-determined time that is asynchronous with pulse enable signal 111A. Circuitry is provided for generated an end pulse signal 205, which is coupled to the CLR input of flip flop 201 and the SET of input 203. Upon receipt of end pulse signal 205, the output Q of flip flop 201 is driven to ground. Complementarily, upon receipt of end pulse signal 205, the output Q of flip flop 203 is driven to system voltage VCC.

In the preferred embodiment, end pulse signal 205 is produced by a multiplexer 207. Multiplexer 207 includes a plurality of data inputs D0–DZ. Multiplexer 207 includes select inputs S0–SN, which are coupled to receive pulse with selection signals 2090–209N from processing unit 150. When enable input E, which is coupled to system voltage VCC, is high (which in the illustrated embodiment it always is) multiplexer 207 outputs at its output 0 the signal received at a selected data input D0–DZ under control of select inputs S0–SN. In one embodiment, multiplexer 207 is implemented in an M16_1E sixteen to one multiplexer, which includes sixteen data inputs (D0–D15) and four select inputs (S0–S3).

In the embodiment illustrated in FIG. 2, the timing of pulses generated according to the present invention is controlled by counting devices including a shift register 211 and a binary counter 213. In the illustrated embodiment, shift register 211 includes parallel outputs Q0–QM, which are selectively coupled to data inputs D1–DX of multiplexer 207. Shift register 211 includes a shift left serial input SLI, which is coupled to system voltage VCC. Shift register 211 includes a count enable input CE, which is also coupled to system voltage VCC. Thus, shift left input SLI and count enable input CE of shift register 211 are always held at the logical high value. Shift register 211 includes a clock input C, which is coupled to receive 80 megahertz asynchronous clock signal 160B1 from asynchronous crystal clock 160 (FIG. 1).

Shift register 211 includes a reset input R which is coupled to a NOR gate 215. NOR gate 215 receives at its inputs pulse enable signal 111A and the output signal 110A of flip flop 201. Thus, when pulse enable signal 111A and the output signal 210A of flip flop 201 are both low, NOR gate 215 outputs a high signal to reset input R of shift register 211; otherwise, NOR gate 215 outputs a low signal to reset input R of shift register 211.

When reset input R of shift register 211 is high, all parallel outputs Q0–QM are reset to low. When clock enable input CE is high and reset input R is low, the data on SLI input is loaded into the first bit of shift register 211 during the low to high clock transition and appears on the Q0 output. During subsequent low to high clock transitions, again when CE is high and R is low, data is shifted to the next highest bit position as new data is loaded into Q0. In a preferred embodiment, shift register 211 is implemented as an 8-bit serial in parallel out shift register such as an SR8RE.

Binary counter 213 includes data outputs Q0–QN, which are selectively coupled to data inputs DY–DZ of multiplexer 207. Counter 213 also includes a clock enable output (CEO) and a terminal count output (TC) which are not used in the illustrated embodiment. Counter 213 includes a clock enable input CE which is coupled to data output QM of shift register 211. Counter 213 includes a clock input C which is coupled to receive asynchronous 40 megahertz clock signal 160B2 from asynchronous crystal clock 160 (FIG. 1). Counter 213 includes reset input R which is coupled to receive start signal $\overline{110A}$ from the Q output of flip flop 203. Reset input R resets all outputs Q0–QN to low when signal $\overline{110A}$ is high. 40 megahertz asynchronous clock signal 160B increments outputs Q0–QN when clock enable CE is high and reset R is low. In a preferred embodiment, counter 213 is CB8RE 8-bit cascadable binary counter.

In the illustrated embodiment, data input D0 of multiplexer 207 is coupled to the output of an AND gate 217. AND gate 217 receives at its inputs clock enable signal 211 and a short pulse enable signal 219 from pulse trigger 111 (FIG. 1). When pulse enable signal 111 and short pulse signal 219 are both high, a high value is applied to input D0 of multiplexer 207, which in turn is out put to the clear and set inputs of flip flops 201 and 203, respectively. In the short pulse mode, pulse enable signal 111 causes complementary outputs 110A and $\overline{110A}$ to go high and low, respectively. Because of silicon delays in the devices, pulse enable signal 111A and short pulse rigger signal 219 cause flip flops 201 and 203 to be cleared and set respectively, a short period of time later, thereby returning complementary outputs 110A and $\overline{110A}$ to their low and high values, respectively. In a preferred embodiment, the short pulse is about five nanoseconds wide.

In operation, complementary output signals 110A and $\overline{110A}$ are normally low and high respectively. Shift register 211 receives 80 megahertz asynchronous clock signal 160B1 at its C input, while counter 213 receives 40 megahertz asynchronous clock signal 160B2 at its C input. Since output signal 110A from flip flop 201, which is coupled to reset input R of shift register 211 through NOR gate 215, is normally low, reset input R of 211 is normally high. Thus, outputs Q0–QM of shift register 211 are normally low. Since signal 110A from flip flop 203, which is coupled to reset input R of counter 213, is normally high, the outputs Q0–QN of counter 213 are normally at their low values.

The width of a pulse produced by pulse generator 110 is determined by the value loaded into select inputs S0–SN of multiplexer 207. The value loaded into multiplexer 207 determines which of inputs D0–DZ of multiplexer 207 is selected for output. Normally, the output of multiplexer 207 is low.

When pulse generator 110 receives a pulse enable signal 111A, flip flop 201 goes high and flip flop 203 goes low. Pulse enable signal 110A also causes reset input R of shift register 211 to go low, thereby enabling shift register 211. Since shift register 211 is clocked by asynchronous clock signal 160B1, there is a delay of as much of 12.5 nanoseconds from the time reset input R goes low and the first low to high transition received at clock input C of shift register 211. When parallel output QM of shift register 211 transitions to high count enable input CE of counter 213 goes high. Data output Q0–QN of counter 213 are incremented by asynchronous 40 megahertz clock signal 160B2. When the input D1–DZ of multiplexer 207 is selected by selector inputs S0–SN receives a high signal from shift register 211 or counter 213, output signal 205 goes high, thereby to clear and set flip flops 201 and 203 respectively. Since the timing of the end of the pulse is controlled by shift register 211, which is clocked asynchronous with pulse enable signal 111, the end pulse signal 205 has a substantially random 12.5 nanosecond jitter. Thus a pulse with a nominal width of 100 nanoseconds can have an actual width that varies from 100 nanoseconds to 112.5 nanoseconds. This random variation produces a spread spectrum of RF radiation, thereby reducing potential electromagnetic interference.

From the foregoing it will be recognized that the pulse generation and timing system of the present invention overcomes the shortcomings of the prior art. The system of the present invention produce fast rise-time square wave pulses, rather than the slow rise-time half-sine wave pulses of the prior art. The system of the present invention provides a large number of user selectable pulse widths. The pulses produced according to the present invention have variable widths, which reduces the EMI problems inherent in the prior art.

The present invention has been illustrated and described with respect to presently preferred embodiments. Those skilled in the art, given the benefit of this disclosure, will recognize alternative embodiments. Accordingly, the foregoing description is intended for purposes of illustration rather than limitation.

What is claimed is:

1. A variable width pulse generator, which comprises:
   circuitry for starting a pulse in response to receipt of a pulse enable signal, said pulse enable signal being synchronous with a first clock having a first time base; and,
   circuitry for ending said pulse a predetermined number of second clock cycles after said pulse enable signal, said second clock cycles having a second time base asynchronous with said first time base.

2. The variable width pulse generator as claimed in claim 1, wherein said circuitry for starting said pulse includes a logic device having an output adapted to go to a first level in response to receipt of said pulse enable signal.

3. The variable width pulse generator as claimed in claim 2, wherein said logic device includes a flip-flop having a first input and a clock input, said clock input of said flip-flop being coupled to receive said pulse enable signal.

4. The variable width pulse generator as claimed in claim 3, wherein said first input of said flip-flop is coupled to a logical high voltage source.

5. The variable width pulse generator as claimed in claim 4, wherein said flip-flop includes a clear input coupled to said circuitry for ending said pulse.

6. The variable width pulse generator as claimed in claim 3, wherein said first input of said flip-flop is coupled to a logical low voltage source.

7. The variable width pulse generator as claimed in claim 6, wherein said flip-flop includes a set input coupled to said circuitry for ending said pulse.

8. The variable width pulse generator as claimed in claim 2, wherein said circuitry for ending said pulse includes a counting device, said counting device including:
   a clock input coupled to receive said clock cycles;
   a second input coupled to receive said pulse enable signal; and,
   an output coupled to said logic device of said circuitry for starting said pulse.

9. The variable width pulse generator as claimed in claim 8, wherein said counting device includes a serial in parallel out shift register.

10. The variable width pulse generator as claimed in claim 8, wherein said circuitry for ending said pulse includes a multiplexer, said multiplexer including a data input coupled to the output of said counting device and an output coupled to said logic device of said circuitry for starting said pulse.

11. The variable width pulse generator as claimed in claim 10, wherein said multiplexer includes a selector input for receiving a select signal.

12. The variable width pulse generator as claimed in claim 8 including an input coupled to the output of said logic device.

13. A symmetrical complimentary variable width pulse generator, which comprises:
   a first logic device, said first logic device including an input coupled to receive a pulse enable signal, said pulse enable signal having a first time base, said first logic device having an output adapted to go to a logical high voltage level in response to receipt of said pulse enable signal at said input of said first logic device, and said first logic device including a clear input coupled to receive an end pulse signal to drive said output of said first logic device to a logical low voltage level;
   a second logic device, said second logic device including an input coupled to receive said pulse enable signal, said second logic device having an output adapted to go to a low high voltage level in response to receipt of said pulse enable signal at said input of said second logic device, arid said second logic device including a set input coupled to receive said end pulse signal to drive said output of said second logic device to a logical high voltage level; and,
   circuitry for generating said end pulse signal, said circuitry including a clock input for receiving an asynchronous clock signal, said asynchronous clock signal having a second time base, said second time base being asynchronous with said first time base.

14. The symmetrical complimentary variable width pulse generator as claimed in claim 13, wherein said circuitry for generating said end pulse signal includes:
   a counting device for counting cycles of said asynchronous clock signal; and,
   means coupled to said counting device for generating said end pulse signal in response to said counting device having counted a preselected number of clock cycles.

15. The symmetrical complimentary variable width pulse generator as claimed in claim 14, wherein said counting device includes an input coupled to receive said pulse enable signal to start said counting device.

16. The symmetrical complimentary variable width pulse generator as claimed in claim 14, wherein said counting device includes a serial-in-parallel-out shift register.

17. The symmetrical complimentary variable width pulse generator as claimed in claim 16, wherein said counting device includes a counter coupled to an output of said serial-in-parallel-out shift register.

18. The symmetrical complimentary variable width pulse generator as claimed in claim 14, wherein said circuitry for generating said end pulse signal includes means for selecting said preselected number.

19. The symmetrical complimentary variable width pulse generator as claimed in claim 18, wherein said circuitry for generating said end pulse signal includes:
   a counting device, said counting device having an clock input coupled to receive said asynchronous clock signal and a reset input coupled to receive said pulse enable signal, and said counting having a plurality of outputs, each of said outputs having a value determined by a number of clock cycles received at said clock input after receipt of said clock enable signal at said reset input; and,
   a multiplexer having a plurality of data inputs coupled to at least some of outputs of said counting device and a multiplexer output for generating said end pulse signal based upon a value received at a selected one of said data inputs.

20. The symmetrical complimentary variable width pulse generator as claimed in claim 19, wherein said multiplexer includes a plurality of selector inputs adapted to receive signals to select said selected one of said data inputs.

21. A variable pulse width time domain reflectometer, which comprises:
   means for generating a pulse enable signal, said pulse enable signal being synchronous with a first clock having a first time base;
   a second clock, said second clock having a second time base asynchronous with said first time base;
   means for starting a pulse in response to said pulse enable signal; and, means for ending said pulse based upon said second time base.

22. A variable width pulse generator, which comprises:

circuitry for starting a pulse in response to receipt of a pulse enable signal, said pulse enable signal having a first time base, said circuitry for starting said pulse including a logic device having an output adapted to go to a first level in response to receipt of said pulse enable signal; and, circuitry for ending said pulse a predetermined number of clock cycles after said pulse enable signal, said clock cycles having a second time base asynchronous with said first time base, said circuitry for ending said pulse includes a counting device, said counting device including:

a clock input coupled to receive said clock cycles;

a second input coupled to receive said pulse enable signal; and, an output coupled to said logic device of said circuitry for starting said pulse.

23. The variable width pulse generator as claimed in claim 22, wherein said counting device includes a serial in parallel out shift register.

24. The variable width pulse generator as claimed in claim 22, wherein said circuitry for ending said pulse includes a multiplexer, said multiplexer including a data input coupled to the output of said counting device and an output coupled to said logic device of said circuitry for starting said pulse.

25. The variable width pulse generator as claimed in claim 24, wherein said multiplexer includes a selector input for receiving a select signal.

26. The variable width pulse generator as claimed in claim 22 including an input coupled to the output of said logic device.

* * * * *